United States Patent [19]

Brice

[11] Patent Number: 4,499,560
[45] Date of Patent: Feb. 12, 1985

[54] NON-VOLATILE FLIP-FLOP WITH A DYNAMIC RESETTING

[75] Inventor: Jean-Michel Brice, Grenoble, France

[73] Assignee: E.F.C.I.S., Grenoble, France

[21] Appl. No.: 425,700

[22] Filed: Sep. 28, 1982

[30] Foreign Application Priority Data

Nov. 20, 1981 [FR] France .............................. 81 21802

[51] Int. Cl.$^3$ ............................................ G11C 11/40
[52] U.S. Cl. .................................... 365/228; 365/154
[58] Field of Search ................. 365/154, 228, 190, 149

[56] References Cited

U.S. PATENT DOCUMENTS

| | | | |
|---|---|---|---|
| 3,676,717 | 7/1972 | Lockwood | 365/228 |
| 4,128,773 | 12/1978 | Troutman et al. | 307/238 |
| 4,207,615 | 6/1980 | Mar | 365/95 |
| 4,400,799 | 8/1983 | Grudger | 365/154 |
| 4,403,306 | 9/1983 | Tokushige | 365/228 |

FOREIGN PATENT DOCUMENTS 2622307 12/1976 Fed. Rep. of Germany .

OTHER PUBLICATIONS

D. Frohman-Bentchkowsky, "The Metal-Nitride-Oxide-Silicon (MNOS) Transistor-Characteristics and Applications", pp. 1207-1219, Proceedings of the IEEE, vol. 58, No. 8, Aug. 1970.

Primary Examiner—James W. Moffitt
Attorney, Agent, or Firm—Oblon, Fisher, Spivak, McClelland & Maier

[57] ABSTRACT

A flip-flop further comprising two branches with MNOS elements serially connected with P channel MOS transistors for permitting a non-volatile storing of the information contained in a flip-flop at a chosen memorizing time. The memorizing of the state of the flip-flop can be made in a single cycle by raising the supply voltage of the device. In the same way, the resetting can be made in a single cycle by restoring abruptily the power voltage.

7 Claims, 7 Drawing Figures

NON-VOLATILE FLIP-FLOP WITH A DYNAMIC RESETTING

BACKGROUND OF THE INVENTION

The invention relates to safety integrated circuits and more specifically to a flip-flop, the content of which, at a given moment, can be stored in a non-volatile way into storage elements, the flip-flop being restorable according to the stored data.

The invention permits to store information contained in a flip-flop if power is interrupted, and to reset automatically the flip-flop while power is restored.

The invention relates more particularly to MOS type devices, that is devices comprising a conductive gate (for example a metal M) formed on an insulating layer (for example an oxide O) above a semiconductor (S).

SUMMARY OF THE INVENTION

The object of the safety circuit according to the invention is to fullfil the following features:
security of operation and in particular:
writing in the non-volatile storage elements from the state of the flip-flop always possible in any operation configuration,
correct and automatic resetting of the flip-flop when power is restored from the state of the non-volatile storage element,
non-perturbation of the flip-flop by the storage elements except during the resetting step,
simplicity of use:
reduction of the number of specific controls necessary for the safety function,
rapidity of the storing and resetting steps in particular as regards the memorization which has to be as short as possible.

For satisfying those requirements, the invention provides for a flip-flop to which is associated a safety circuit permitting it to have a non-volatile storage function, the control of the storing and the resetting steps being possible by only modifying the power voltage.

For attaining this object, the invention provides for a non-volatile storage flip-flop comprising a classical MOS flip-flop with complementary terminals Q and Q*, connected between a power voltage (VCC) and a reference voltage (M) to which two storage branches are added. Each of the storage branches comprises the serial connection of a non-volatile storing element of the type electrically programmable threshold voltage MOS transistor and a capacitor. A terminal of each of the capacitors is connected with the power voltage. One of the main terminals and the control terminal of the storing element of the first branch are respectively connected with the Q and Q* terminals and conversely as regards the storing element of the second branch. According to the values of the power voltage, the following functions are obtained: normal operation of the flip-flop independently from the non-volatile storage circuit, memorizing of the state of the flip-flop, storing, resetting the flip-flop.

The classical flip-flop can for example comprise complementary MOS transistors or enhanced and depleted MOS transistors. The storing elements can be MNOS (metal-nitride-oxide-semiconductor) transistors, the substrate of which is connected with the source. Those storing elements can also be of the floating gate type. For permitting the operation of the non-volatile flip-flop according to the invention in its four steps, that is normal operation independently of any storage, memorizing, storage and resetting, the power voltage can vary between a first level permitting the classical operation of the flip-flop and a second level permitting to modify the threshold of the storing element. The power voltage is also liable to be removed, that is the reason for which a non-volatile storage is provided for.

During the normal operation, the memorizing and the storing, the variations of the supply voltage are slow with respect to the time constant associated with the storing branches and the capacitances operate like open switches. Then, during the resetting period, the power voltage is rapidly restored at its first level and the capacitances operate in a transitory way like closed switches.

According to an advantage of the invention, it will be noted that the storage elements are submitted to an operation cycle only when the content of the flip-flop is to be memorized. There is no change of state of those elements at each change of state of the flip-flop. This feature is of importance, in particular when MNOS type transistors are used as storing elements, because the operating cycles of such MNOS transistors are limited to values in the range of $10^6$ to $10^8$ cycles.

The invention reaches the advantages enumerated above and also the advantage that the memorizing is made in a particularly simple and quick way, by only one control cycle, further to the modification of the power voltage.

DESCRIPTION OF THE DRAWINGS

Those objects, features and advantages together with others of the invention will be explained in greater detail in the following description of preferred embodiments made in connection with the attached drawings wherein.

DESCRIPTION OF THE PREFERRED EMBODIMENTS

Figure 1:
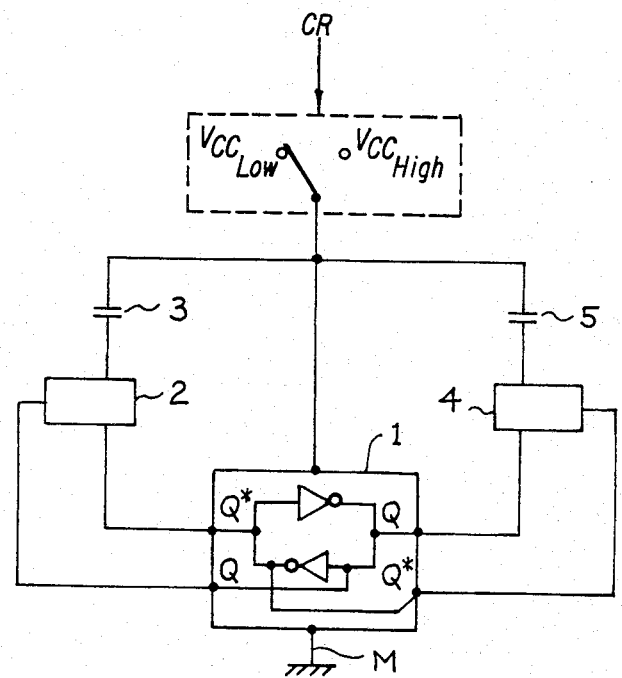
FIG. 1 shows in a schematical and generalized way a non-volatile flip-flop according to the invention.

In the drawings showing the flip-flops, the input/output conductors and peripherals of the flip-flop connected with the terminals Q and Q* have not been shown. They are carried out in a classical way.

FIG. 1 generally and schematically shows the circuit according to the invention. This circuit comprises a classical bistable flip-flop comprising complementary terminals Q and Q*, each of which can take the one or the other of two logical states, but never the same state. This flip-flop is connected between a power source VCC, for example 5 volts, and a reference voltage M, for example the ground. Accordingly, the two logical states Q and Q* correspond to the voltage VCC or to the ground voltage. In the normal flip-flop operation, the voltage VCC is usually of about 5 volts.

One assumes that the flip-flop 1 is of the volatile type, that is, if the power VCC is removed, the last state of the flip-flop is lost. For having a safety of the last information memorized before the removal of the power, two storing branches each comprising a storage element, respectively 2 and 4, and a capacitor, respectively 3 and 5 are added to the flip-flop. These two branches are arranged between one of the flip-flop outputs and the power voltage VCC. The storage elements 2 and 4 are MOS transistors with two electrically programmable threshold voltages and comprise two main terminals and a control terminal. The control terminal is connected with the node of the flip-flop complementary of the one to which is connected one of the main terminals.

For operating a safety operation, that is conditioning the storage elements 2 and 4, the power voltage VCC is increased immediately before the removal of the power. In case of a voluntary interruption of the power voltage, this is easy to make. In case of an undesigned interruption of the power voltage, there are known circuits for providing during a short time duration such a high voltage as soon as a lowering of the normal power voltage is detected, the source of high voltage being for example capacitors fed during the normal operation of the device. Accordingly, when the high voltage appears, it is applied between the terminals Q and Q* of the flip-flop and operates in an inverse way between the control terminal and one of the main terminals for each of the storing elements 2 and 4. If the programmation threshold voltage of the storing elements in higher than the normal operation voltage of the flip-flop, which is generally the case in the usual devices, this permits to set the storing elements 2 and 4 in complementary states. The way in which the memorized state in the storing elements 2 and 4 is used for resetting the flip-flop when the power is returned will be explained in detail hereinafter in connection with the description of a preferred embodiment of the invention in order to simplify the description.

The storing elements of the type "electrically programmable threshold voltage MOS transistors" are for example MNOS (metal-nitride-oxide-semiconductor) cells or floating gate transistors as those currently called Flotox transistors. Practically, the storing elements 2 and 4 are chosen among elements manufacturable in a compatible way with the elements constituting the bistable flip-flop 1. For example, if one uses floating grid transistors of the Flotox type, the more easily compatible technology is presently the MOS technology of the type with enhanced/depeleted N channel MOS transistors. Alternatively, MNOS storing elements are presently compatible with the manufacturing of a CMOS flip-flop. This latter embodiment will be disclosed hereinafter as an example and a detailed description of the operation mode of the non-volatile storage flip-flop according to the invention will be disclosed in connection with this embodiment.

Figure 2:
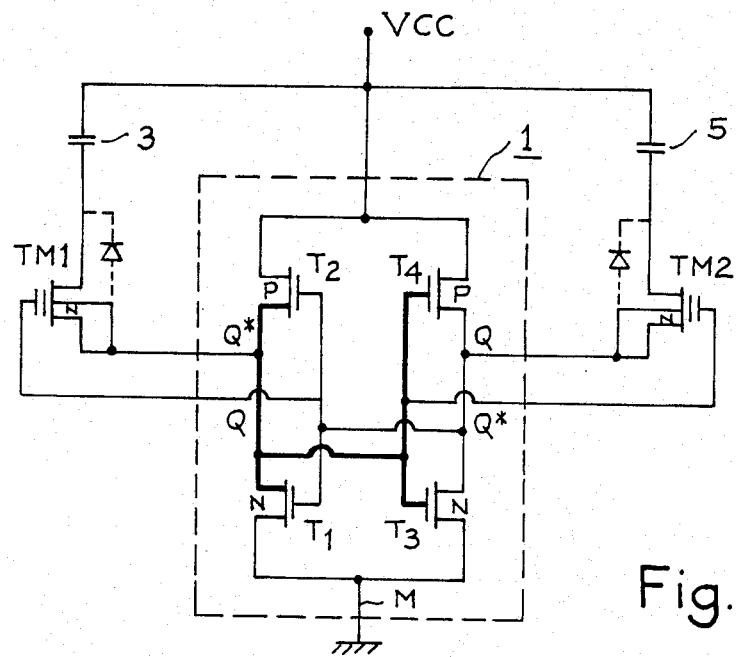
FIG. 2 shows a first embodiment of a device according to the invention wherein the classical flip-flop comprises complementary MOS transistors.

In the embodiment shown in FIG. 2, the flip-flop 1 comprises complementary MOS transistors (CMOS). It comprises four transistors T1 to T4, the transistors T1 and T3 being of the N channel type and the transistors T2 and T4 of the P channel type. The transistors T1 and T2 are serially connected between the ground and the power voltage VCC. The transistors T3 and T4 are connected in the same way. The gates of transistors T1 and T2 are connected with the drain/source connection point of transistors T3 and T4 and the gates of transistors T3 and T4 are connected with the source/drain connection point of transistors T2 and T1. The terminal corresponding to the connection of the gates of the transistors T3 and T4 is designated by Q* and the connection of the gates of the transistors T1 and T2 is designated by Q.

The operation of this flip-flop, well known per se, will not be disclosed in detail here. To this flip-flop are added according to the invention two storing branches. The first branch connected to the terminal Q* comprises an MNOS element TM1 serially connected with a capacitor 3, the other terminal of which is connected to the power voltage VCC. In the same way, the second branch, connected between the terminal Q and the power voltage VCC, comprises an MNOS element TM2 and a capacitor 5. The gate of the MNOS storing element TM1 is connected with the terminal Q and the gate of the element TM2 with the terminal Q*. The source and the substrate of each of the transistors TM1 and TM2 are interconnected respectively with the terminal Q* and the terminal Q. Stray diodes appearing between the substrate and drain terminals of transistors TM1 and TM2 are also shown in FIG. 2.

Figure 3:
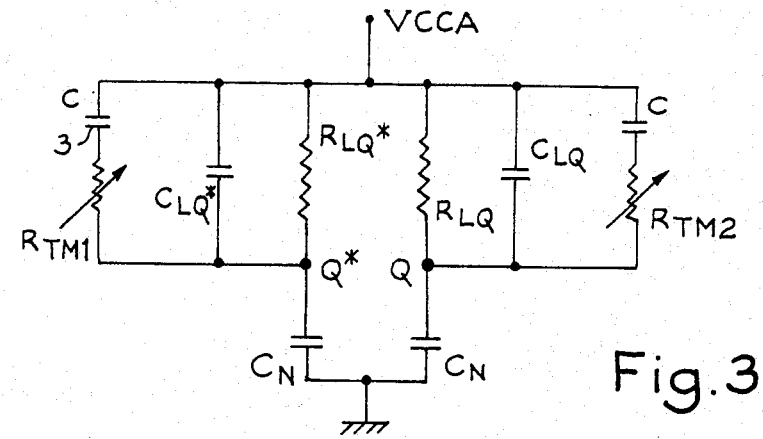
FIG. 3 shows an electrical equivalent of the circuit of FIG. 2 in a dynamic state.

FIG. 3 shows an electrical equivalent of the circuit of FIG. 2 when it operates in a dynamic state. A plurality of capacitors and resistors corresponding to the equivalent capacitances of the various elements are shown between the terminal VCC and the reference terminal M. The capacitors 3 and 5 have a value C, for example a value comprised between some tenth of pF and some pF. The MNOS elements have equivalent resistances $R_{TM1}$ and $R_{TM2}$ which are high (some hundred megohms) when those devices are set in a blocking state and low (some kilohms) when those devices are conditioned to a conductive state. The transistors T2 and T4 of the flip-flop, which can also be considered as charge elements, have equivalent impedances designated by $C_{LQ*}$, and $R_{LQ*}$ or $C_{LQ}$ and $R_{LQ}$ respectively as regards transistor T2 connected to the terminal Q* or the transistor T4 connected to the terminal Q. In fact, in case of a symmetrical circuit as shown, we will substantially obtain: $R_{LQ}=R_{LQ*}$ and $C_{LQ}=C_{LQ*}$. The N channel transistors T1 and T3 are illustrated as equivalent capacitors having a value $C_N$.

Figure 4:
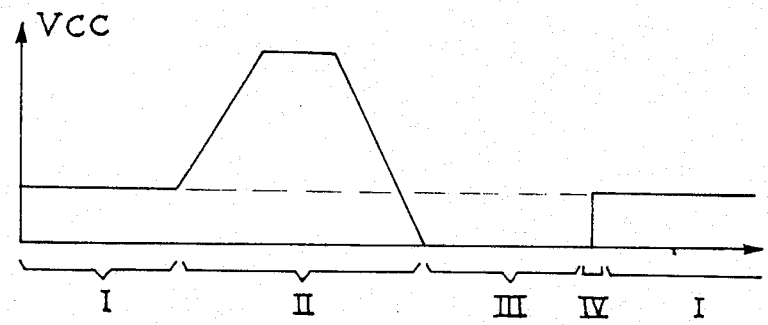
FIG. 4 shows the supply voltage applied to the device during its various operating steps.

The operation of this device will be disclosed in connection with FIG. 4 which shows the variation of the voltage applied to the supply terminal VCC.

In the step I of normal operation, the voltage VCC is the normal operation voltage of the flip-flop, for example 5 volts. In this configuration, the voltage applied between gate and source-substrate of the elements TM1 and TM2 is more or less 5 volts, that is not enough to change the threshold state of those elements. Thus, the only influence of the storing branches on the operation of the flip-flop resides in the supplementary capacitive load at the terminals Q and Q* due to the presence of the MNOS elements. According to an important feature of the invention, it will be noted that the 5 volts voltage applied to the MNOS elements during changes of states of the flip-flop which do not induce a programmation of those elements, does not produce any ageing of those elements. In these conditions, the bistable flip-flop can present an illimited number of state changes.

During the step II of memorizing, the potential at the terminal VCC is momentaneously risen at a high level with respect to the reference voltage, for example 18 volts, for acting on the threshold voltages of the MNOS elements. In this state, a positive or negative voltage of 18 volts is applied between gate and source-substrate of the MNOS elements TM1 and TM2. Specifically, if we assume that Q* is high and Q low in the last state of the flip-flop, the element TM1 has a voltage of 0 volt on its gate and 18 volts on its source and its substrate, while the element TM2 has a voltage of 18 volts on its gate and a voltage of 0 volt on its source and its substrate. Consequently, the element TM1 is programmed to its low threshold voltage and the element TM2 to its high threshold voltage. Therefore, for a gate-source voltage equal to 0, the element TM1 is in a depleted state, that is it is turned on (low impedance) between its drain and its source while the element TM2 is in an enhanced state, that is it is turned off (high impedance) between its drain and its source. This memorizing step occurs without any flow of static current due to the presence of capacitors 3 and 5. Thus, the consumption of the circuit remains very low.

Of course, the variation of the supply voltage from 5 to 18 V will be rapid but not enough for considering a dynamic current circulating through the capacitors 3 and 5.

After this memorizing step, the normal operation of the device can be restored, the stored state in the MNOS elements possibly permitting to reset the flip-flop on its state existing at the time of the memorizing. But, usually, the memorizing step is followed with a storing step III during which the supply voltage VCC and the control signal CR are at a zero level or floating. Again the variation of the voltage from 18 to 0 or 5 V will be made in order to have a negligeable contribution of the dynamic state.

For resetting the flip-flop, as shown during the step IV of FIG. 3, a supply voltage VCC is reapplied abruptly.

On the equivalent electrical representation, in this state, $R_{TM1}$=some kilohms, $R_{TM2}$=some hundreds megohms, $C_{LQ}=C_{LQ^*}$ in the range of 0,01 pF, $R_{LQ}=R_{LQ^*}$ in the range of some kilohms and $C_N$ is in the range of 0,1 pF. In view of the high value of $R_{TM2}$, it can be considered that the capacitor 5 on the side of node Q is not operating. Therefore, further to a variation dVCC of the supply voltage, the resultant variations $dV_{Q^*}$ and $dV_Q$ will be as follows:

$$dV_Q = dVCC \frac{C_L}{C_N + C_L} \# dVCC \frac{C_L}{C_N}$$

$$dV_{Q^*} = dVCC \frac{C + C_L}{C + C_N + C_L} \# dVCC$$

With the above indicated respective values of C, $C_N$ and $C_L$, that is $C>C_N>C_L$, $V_{Q^*}$ varies substantially like VCC while $V_Q$ presents little variations. Therefore, the flip-flop will be positioned in the state in which $V_{Q^*}$ is closed to VCC while $V_Q$ remains at the reference potential, which corresponds to the initially memorized logic state.

For obtaining this result, the circuit must be in fact in a dynamic state, that is the rising time of the voltage VCC has to be short enough for having principally capacitive effects. In other words, this rising time must be much lower than the time constants $R_LC_N$ and $R_{TM1}(C+C_N)$. With the numerical values indicated above, it will be noted that those time constants are in the microsecond range.

As regards technology, the circuit disclosed in FIG. 2 can be carried out by using CMOS technology on bulk or on insulating substrate. In case of an insulating substrate, the transistors are naturally isolated the ones from the others. In case of a bulk technology, the N channel transistors T1 and T3 and the MNOS N channel elements TM1 and TM2 are implanted into P type islands. Those islands are connected either to the ground or to the source of the N channel transistors comprised in those islands, as shown in the drawing. The stray diode island/substrate has a given junction capacitance; its breakdown voltage is higher than the voltages applied to the circuit and its stray current is negligible.

Hereinover, a flip-flop associated with two storing branches for obtaining a non volatile function has been described. The classical flip-flop precedently disclosed was of the symmetrical type and had to be as symmetrical as possible for operating satisfactorily even when the distance between the two thresholds of the storing elements TM1 and TM2 decreases while those devices become aged. It would also be possible to provide for an asymmetrical flip-flop which is automatically reset on a given state in the absence of storing branches and to associate to such an asymmetrical flip-flop a single storage branch permitting to reset this flip-flop in its other state when the storing element associated with this flip-flop is in its low impedance state. The control mode of such an asymmetrical flip-flop is identical to the one formerly disclosed. The advantage of this structure lies in the diminution of the used surface of silicon but the drawback is that the asymetrical flip-flop is less sensible than a symmetrical one which means in particular that such a flip-flop necessitates for presenting a satisfactory operation a larger difference between the off-state and the on-state of the MNOS elements.

Figure 5:
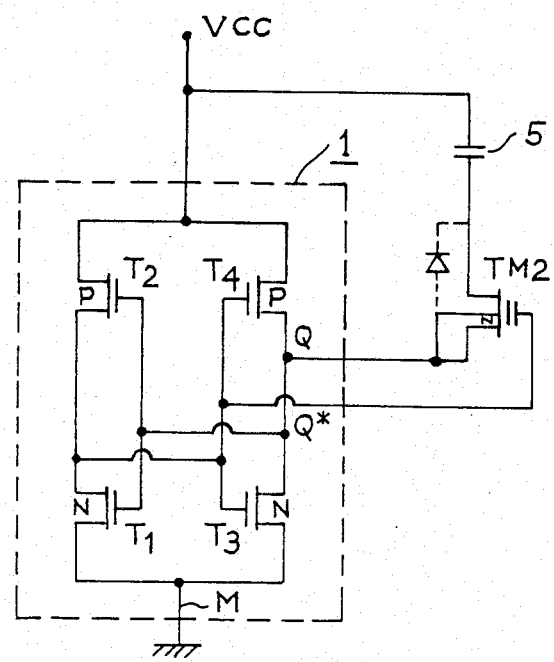
FIG. 5 shows a second embodiment of a device according to the invention wherein the flip-flop is not symmetrical.
Figure 6:
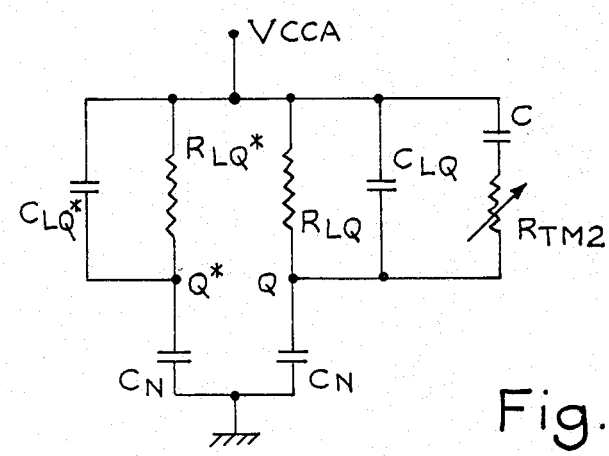
FIG. 6 shows an electrical equivalent of the circuit of FIG. 5 in a dynamic state.

FIGS. 5 and 6 respectively show an embodiment and an electrical equivalent in a dynamic state of such an asymmetrical circuit. The storing branch comprising the capacitor 3 and the storing element TM1 has been suppressed. The flip-flop is made asymmetric in order that, when the storing element TM2 has a high impedance, an automatic resetting occurs with a 0 on the terminal Q*. The remaining storing branch permits to obtain a restoring on a 0 at the node Q when such a state has been memorized. For obtaining this result, C has to be chosen higher than $C_N$ and $C_N^*$, those values being higher than $C_{LQ^*}$ and $C_{LQ}$, but, additionally, a dissymetry must be created by providing that $R_{LQ^*}$ is lower than $R_{LQ}$, $C_{NQ}$ higher than $C_{NQ^*}$ and $C_{LQ^*}$ higher than $C_{LQ}$.

For obtaining such a dissymetry and the above relations, the surface of the transistors T1 and T2 can be higher than the ones of transistors T3 and T4.

Figure 7:
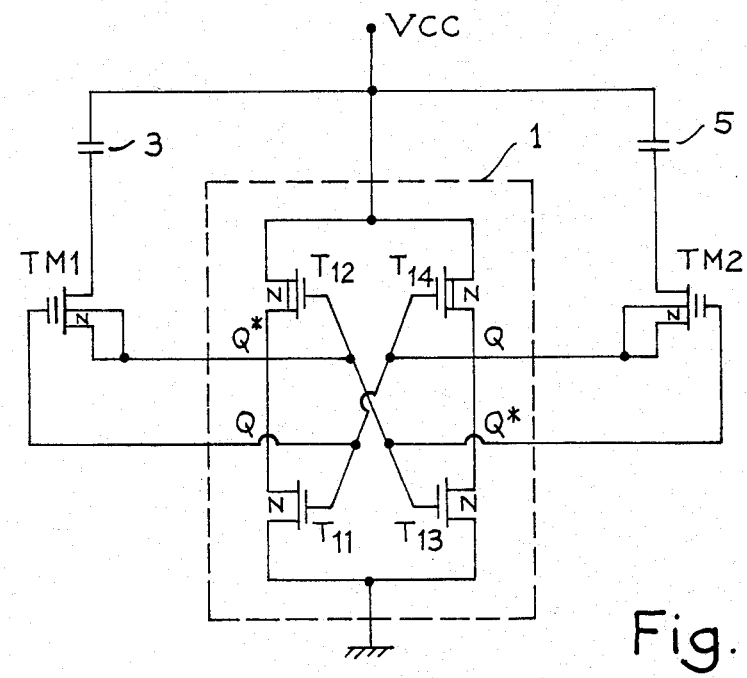
FIG. 7 shows a third embodiment of a device according to the invention wherein the classical flip-flop comprises enhanced/depleted MOS transistors.

FIG. 7 shows another embodiment of the invention wherein the classical symmetric flip-flop 1 no longer comprises complementary MOS transistors but an association of enhanced and depleted MOS transistors. This flip-flop comprises four N channel transistors T11 to T14. The transistors T11 and T12 are serially connected like the transistors T13 and T14. The transistors T11 and T13 are of the enhanced type, that is they are normally off, and the transistors T12 and T14 are of the depleted type, that is they are normally on. The gates of transistors T12 and T13 are connected the one to the other and to the drain/source junction of transistors T11 and T12. The gates of transistors T11 and T14 are interconnected with the drain/source connection of transistors T13 and T14.

The storing branches and the storing elements are connected as formerly disclosed in connection with FIG. 2. The bistable flip-flop shown in FIG. 7 is known per se. It has been described herein only for emphasizing the fact that the invention is not limited to the use of a specific type of flip-flop. In case the classical flip-flop uses a combination of enhanced/depleted N channel transistors, it is presently technologically simple to associate with such a flip-flop, floating gate transistors constituting the storing elements TM1 and TM2.

The variants disclosed formerly are only examples of modifications which can be made to the basic circuit shown in a particular way in FIG. 2 and, more generally, in FIG. 1. Of course, other variants can be provided without departing from the scope of the invention and, in particular, the variants disclosed can be combined.

What is claimed is:

1. A non-volatile storing flip-flop with a dynamic resetting comprising a classical MOS transistor flip-flop with complementary nodes Q and Q* connected between a supply voltage and a reference voltage, further comprising at least one storing branch, each of which comprises the serial connection of a non-volatile storing element (electrically programmable threshold voltage MOS transistor) and a capacitor, a terminal of each capacitor being connected to the supply voltage, one of the main terminals and the control terminal of the storing element of the first branch being connected respectively to the node Q and the node Q* and reciprocally as regards the storing elements of the second branch; and further comprising means for modifying the supply voltage between a first level permitting the normal operation of the flip-flop and a second level permitting to condition the storing elements for memorizing the state of the flip-flop, said means also permitting to modify abruptly the power voltage from zero to the first level, thereby automatically resetting the flip-flop in the memorized state.

2. A non-volatile storing flip-flop according to claim 1 wherein the classical flip-flop comprises complementary transistors.

3. A non-volatile storage flip-flop according to claim 1 wherein the classical flip-flop comprises enhanced/depleted transistors.

4. A non-volatile storing flip-flop according to claim 2 wherein the storing elements are of the MNOS type, with their substrate connected to their source.

5. A non-volatile storing flip-flop according to claim 3 wherein the storing elements are of the floating gate MOS type.

6. A non-volatile storing flip-flop according to claim 1 comprising two storing branches, the flip-flop being symmetrical.

7. A non-volatile storing flip-flop according to claim 1 comprising only one storing branch connected with one of the nodes of the flip-flop, the elements of the flip-flop connected to the other node by their drain/source connection occupying a larger surface than the elements connected to the first node.

* * * * *